US007994472B2

(12) United States Patent
Plettner et al.

(10) Patent No.: US 7,994,472 B2
(45) Date of Patent: Aug. 9, 2011

(54) LASER-DRIVEN DEFLECTION ARRANGEMENTS AND METHODS INVOLVING CHARGED PARTICLE BEAMS

(75) Inventors: Tomas Plettner, San Ramon, CA (US); Robert L. Byer, Stanford, CA (US)

(73) Assignee: The Board of Trustees of the Leland Stanford Junior University, Palo Alto, CA (US)

(*) Notice: Subject to any disclaimer, the term of this patent is extended or adjusted under 35 U.S.C. 154(b) by 214 days.

(21) Appl. No.: 12/485,616

(22) Filed: Jun. 16, 2009

(65) Prior Publication Data

US 2009/0314949 A1 Dec. 24, 2009

Related U.S. Application Data

(60) Provisional application No. 61/061,916, filed on Jun. 16, 2008.

(51) Int. Cl.
*G21K 1/08* (2006.01)
*H01J 37/26* (2006.01)

(52) U.S. Cl. ...................... 250/251; 250/396 R; 250/306

(58) Field of Classification Search .................. 250/251, 250/396 R, 397, 306, 309, 310, 311
See application file for complete search history.

(56) References Cited

U.S. PATENT DOCUMENTS

| | | | | |
|---|---|---|---|---|
| 2005/0185280 | A1* | 8/2005 | Kaule | 359/566 |
| 2007/0170370 | A1* | 7/2007 | Gorrell et al. | 250/396 R |
| 2009/0154649 | A1* | 6/2009 | Behling | 378/137 |

OTHER PUBLICATIONS

T. Plettner, R.L. Byer, "*A Proposed Tabletop Laser-Driven Coherent X-Ray Source*."

T. Plettner, "*Phase Synchronicity Conditions From Pulse-Front Tilted Laser Beams in Periodic Structures*, " SLAC-PUB-12458 (2007).

M. Hogan et al, "*Measurements of Gain Larger than 105 at 12 μm in a Self-Amplified Spontaneous-Emission Free-Electron Laser*," Phys. Rev. Lett., vol. 81, No. 22, pp. 4867-4870 (1998).

T. Plettner and R.L. Byer, "*A Proposed Laser-Driven, Dielectric Microstructure Few-CM Long Undulator for Attosecond Coherent X-Rays*," E.L. Ginzton Laboratories, Stanford University (Apr. 17, 2007).

T. Plettner and R.L. Byers, "*Proposed Dielectric-Based Microstructure Laser-Driven Undulator*," Phys. Rev. Special Topics—Accelerators and Beams, 11, pp. 0330704-1-10 (2008).

T. Plettner, "*Structure-Loaded Vacuum Laser-Driven Particle Acceleration Experiments at SLAC and Possible Applications*," PHAST Conference (May 2007).

T. Plettner, R.L. Byer, P.P. Lu and K. Sun, "*Photonic Device Particle Accelerators and Light Sources*," CLEO Europe 2007, Muenchen, Germany.

(Continued)

*Primary Examiner* — Robert Kim
*Assistant Examiner* — Nicole Ippolito Rausch
(74) *Attorney, Agent, or Firm* — Crawford Maunu PLLC

(57) ABSTRACT

Systems, methods, devices and apparatus are implemented for producing controllable charged particle beams. In one implementation, an apparatus provides a deflection force to a charged particle beam. A source produces an electromagnetic wave. A structure, that is substantially transparent to the electromagnetic wave, includes a physical structure having a repeating pattern with a period L and a tilted angle α, relative to a direction of travel of the charged particle beam, the pattern affects the force of the electromagnetic wave upon the charged particle beam. A direction device introduces the electromagnetic wave to the structure to provide a phase-synchronous deflection force to the charged particle beam.

16 Claims, 9 Drawing Sheets

OTHER PUBLICATIONS

SLAC-R-593, "*Linac Coherent Light Source (LCLS) Conceptual Design Report*," http://www.slac.stanford.edu/pubs/slacreports/slac-r-593.html (2002) (first page only).

L. Schächter et al., "*Scaling Laws of a Dielectric Optical Accelerator*," Proceedings of the 2003 Particle accelerator conference pp. 722-724 (2003).

P. Hommelhoff, Y. Sortais, A. Aghajani-Talesh, and M. A. Kasevich, "*Field Emission Tip as a Nanometer Source of Free Electron Femtosecond Pulses*," PRL 96, 077401 (2006).

J.W. Lewellen, J. Noonan, "*Field-emission cathode gating for rf electron guns*," Phys. Rev. ST AB 8 033502 (2005).

Y.C. Huang, D. Zheng, W.M. Tulloch, and R.L. Byer, "*Proposed structure for a crossed-laser beam GeV per meter gradient, vacuum electron linear accelerator*," Appl. Phys. Lett. 68 (6), 753-755 (Feb. 1996).

X. Eddie Lin, "*Photonic band gap fiber accelerator*," Phys. Rev. ST AB, vol. 4, 051301 (2001).

B. Cowan, "*Two-dimensional photonic crystal accelerator structures*," Phys. Rev. ST AB, vol. 6, 101301 (2003).

J. Rosenzweig, A. Murokh, and C. Pellegrini, "*A proposed dielectric-loaded resonant laser accelerator*," Phys. Rev. Lett. vol. 74, No. 13, pp. 2467-2471 (1995).

T. Plettner, P.P. Lu, and R.L. Byer, "*Proposed Few-Optical Cycle Laser-Driven Particle Accelerator Structure*," Phys. Rev. ST AB 9, 111301 (2006).

Z. Zhang, S. G. Tantawi, and R. D. Ruth, "*Distributed Grating-Assisted Coupler for Optical All-Dielectric Electron Accelerator*," Phys. Rev. ST AB 8, 071302 (2005).

B. Cowan, "*Three-Dimensional Photonic Crystal Laser-Driven Accelerator Structures*," SLAC-PUB-12090 (Aug. 2006).

M. Lincoln et al, "*Experimental Work with Photonic Bandgap Fiber: Building a Laser Electron Accelerator*," SLAC-PUB-12087 (Aug. 2006).

E. Colby and P. Musumeci, "*Report of the Electromagnetic-Structure Based Accelerator Concepts Working Group*,"SLAC-PUB-12437 (2006).

Y. Yao and Y.C. Huang, "*Mode and Gain Analysis for Symmetric and Staggered Grating-Waveguide Free-Electron Laser*," Phys. Rev. ST AB 10 030701 (2007).

B. C. Stuart et al., "*Laser-Induced Damage in Dielectrics with Nanosecond to Subpicosecond Pulses*," Physical Review Letters 74, 2248 (Mar. 1995).

N. Na, R. H. Siemann, and R. L. Byer, "*Energy Efficiency of an Intracavity Coupled, Laser-Driven Linear Accelerator Pumped by an External Laser*," SLAC-PUB-11311 (2005).

S. Reiche, "*GENESIS 1.3, A Fully 3D Time-Dependent FEL Simulation Code*", Nucl. Instrum. Methods Phys. Res. A 429 243-248 (1999).

S. Tanaka, S. Mukamel, "*Coherent X-ray Raman Spectroscopy: A Nonlinear Local Probe for Electronic Excitations*", Phys. Rev. Lett., vol. 89, No. 4, 043001 (Jul. 2002).

A. Föhlisch et al., "*Direct observation of electron dynamics in the attosecond domain*", Nature 436, pp. 373-376 (Jul. 2005).

T. J. Bürnevich, J. Evers and C. Keitel, "*Nuclear Quantum Optics with X-ray Laser Pulses*", Phys. Rev. Lett. 69 142501 (2006).

S. P. Kim and D. N. Page, "*Improved approximations for fermion pair production in inhomogeneous electric fields*", Phys. Rev. D 75 045013 (2005).

Z. Huang and R. Ruth, "*Fully Coherent X-Ray Pulses from a Regenerative-Amplifier Free-Electron Laser*", Phys. Rev. Lett. 96, 144801 (2006).

J. Sekutowicz et al., "*Proposed Continuous wave energy recovery operation of an X-ray free electron laser*", Phys. Rev. ST AB 8, 010701 (2005).

A. Mostaci and F. Ruggiero, "*Wakefields due to surface waves in a beam pipe with a periodic rough surface*", Phys. Rev. ST AB. 5 044401 (2002).

Z. Huang and K. Kim, "*Review of X-ray free-electron laser theory*," Phys. Rev. ST AB 10, 034801 (2007).

S. Reiche et al., "*Optimization of the LCLS X-ray FEL output performance in the presence of strong undulator wakefields*," Proceedings of 2005 Particle Accelerator conference, Knoxville, Tennessee, pp. 2396-2398 (2005).

E. L. Saldin, E.A. Schneidmiller and M.V. Yurkov, "*Influence of an energy chirp on SASE FEL operation*," Proceedings of the $27^{th}$ International Free Electron Conference pp. 258-261 (2005).

A.A. Zholents and W.M. Fawley, "*Proposal for intense attosecond radiation from an X-ray Free-Electron Laser*," Phys. Rev. Lett., vol. 92, No. 22, 224801 (Jun. 2004).

A.A. Zholents and G. Penn, "*Obtaining attosecond x-ray pulses using a self-amplified spontaneous emission free-electron laser*," LBNL Technical Report LBNL-56773 (Jan. 2005).

* cited by examiner

LASER-DRIVEN DEFLECTION ARRANGEMENTS AND METHODS INVOLVING CHARGED PARTICLE BEAMS

RELATED PATENT DOCUMENTS

This patent document claims the benefit, under 35 U.S.C. §119(e), of U.S. Provisional Patent Application Ser. No. 61/061,916 filed on Jun. 16, 2008 and entitled "Laser-Driven Deflection Arrangements and Methods Involving Charged Particle Beams;" this patent document and the Appendices filed in the underlying provisional application are fully incorporated herein by reference.

FEDERALLY-SPONSORED RESEARCH AND DEVELOPMENT

This invention was made with Government support under contract DE-AC02-76SF00515 awarded by the Department of Energy. The U.S. Government has certain rights to this invention.

FIELD OF INVENTION

The present invention relates generally to laser-driven deflection arrangements and methods involving charged particle beams.

BACKGROUND

The generation and control of relativistic charged-particle beams operating at high frequencies is of import to a variety of different applications. A few example applications range from experimental physics, imaging, detection and even medical treatment. Many current sources of such relativistic charged-particle beams require a long path (e.g., hundreds or thousands of meters) over which to generate and control the relativistic charged-particle beams. This type of requirement, however, frustrates the use of relativistic charged-particle beams in many applications. One example of an application that would benefit from a smaller and controllable relativistic charged-particle beam source is in the field of security screening.

Prevention of radiological terrorism is of growing concern. The demand for nuclear detectors at border crossing and shipping locations is ever increasing. The sheer quantity of goods that enter the United States (over 7 million cargo containers enter U.S. ports each year), however, renders many current detection mechanisms inadequate or impractical. Moreover, the nuclear detectors that require significant training and expertise render the systems difficult to use by law enforcement officials. For example, active nuclear detector systems emit gamma rays to identify nuclear materials in containers. Many of these nuclear detectors are prohibitively expensive, difficult to operate and easily fooled by adequate shielding.

As a possible improvement for such nuclear detectors, as well as for many other applications, development efforts for ultra-low emittance and optically bunched electron sources as well as for dielectric-structure laser-driven particle accelerators are of great import.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

SUMMARY

The present invention is directed to laser-driven deflection arrangements and methods involving charged particle beams, e.g., using a patterned-tilted undulator, in a manner that addresses challenges including those mentioned above. These and other aspects of the present invention are exemplified in a number of implementations and applications, some of which are shown in the figures and characterized in the claims section that follows.

Systems, methods, devices and apparatus are implemented for producing controllable charged particle beams. In one implementation, an apparatus provides a deflection force to a charged particle beam. The apparatus is implemented using an undulation structure that is substantially transparent to the electromagnetic wave and that includes a physical structure having a repeating pattern with a period and having a tilted angle, relative to a direction of travel of the charged particle beam. The pattern is arranged and used to modify a force of the electromagnetic wave upon the charged particle beam.

In a more specific example, the present invention is directed to and involves a source that produces an electromagnetic wave. An undulation structure, that is substantially transparent to the electromagnetic wave, includes the above-characterized physical structure with the repeating pattern and tilted angle. A direction device introduces the electromagnetic wave to the structure to provide a phase-synchronous deflection force to the charged particle beam.

Consistent with another embodiment, an electron ring device provides a charged particle beam. A source produces an electromagnetic wave. An undulation structure includes a ring or circularly-shaped lumen for guiding the charged particle beam and is otherwise consistent with the above-characterized physical structure with the repeating pattern and tilted angle. Within the undulation structure are one or more accelerator structures that are transparent to the electromagnetic wave and similarly include a physical structure having such a repeating pattern and period. A deflector structure can also be part of the undulation structure. A direction device introduces the electromagnetic wave to the structure to provide a phase-synchronous deflection force to the charged particle beam.

According to an embodiment of the present invention, an imaging device is implemented that uses a charged particle beam. A source produces an electromagnetic wave. A structure, that is substantially transparent to the electromagnetic wave, includes a physical structure having a repeating pattern having a period L and a tilted angle $\alpha$, relative to a direction of travel of the charged particle beam, the pattern modifying force of the electromagnetic wave upon the charged particle beam, wherein L and $\alpha$ are non-zero values. An electromagnetic wave director introduces the electromagnetic wave to the structure to provide a phase-synchronous deflection force to the charged particle beam. An imaging sensor detects the charged particle beam.

The above summary is not intended to describe each illustrated embodiment or every implementation of the present invention.

BRIEF DESCRIPTION OF DRAWINGS

The invention may be more completely understood in consideration of the detailed description of various embodiments of the invention that follows in connection with the accompanying drawings in which.

Figure 1A:
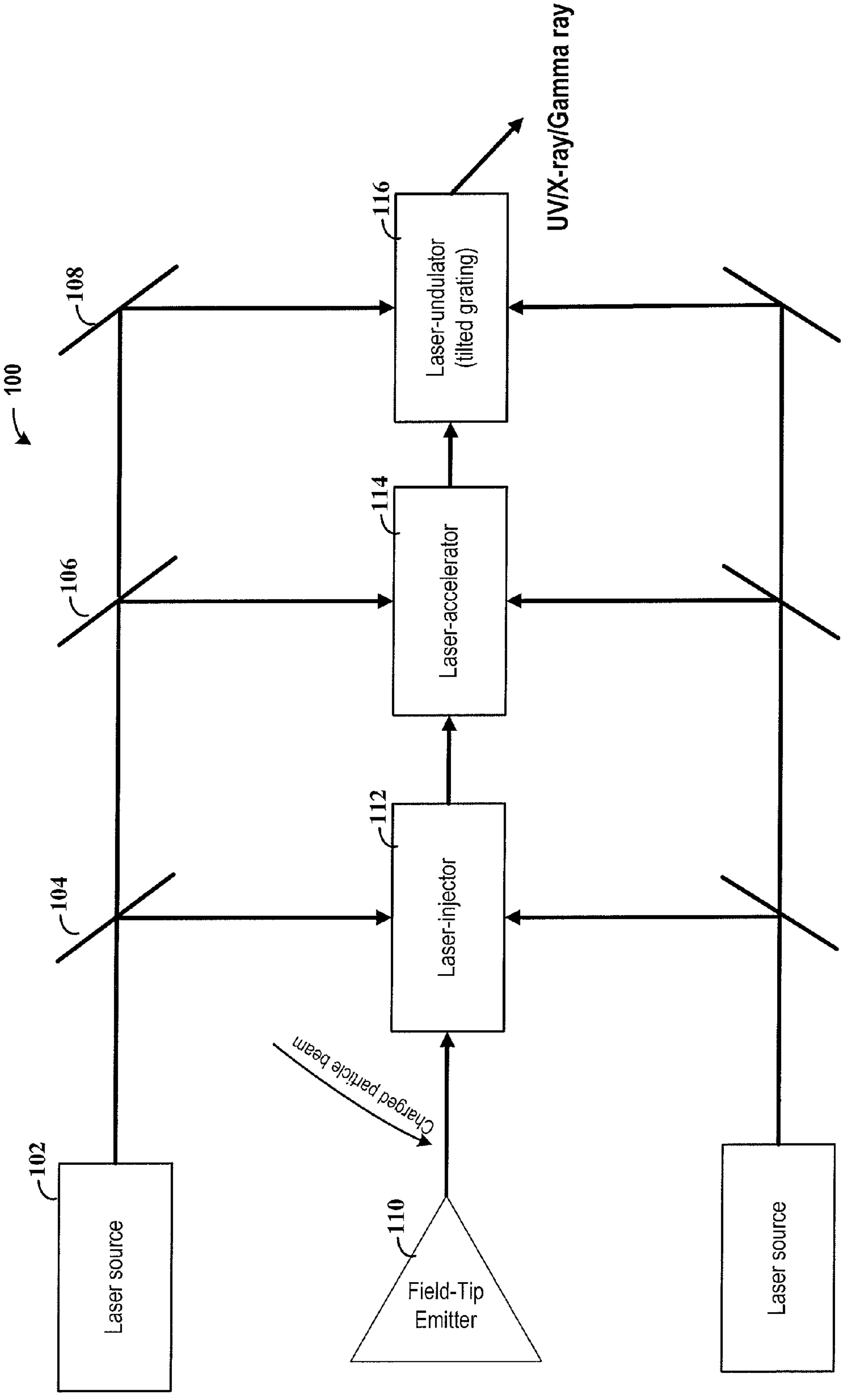
FIG. 1A depicts a system for generating and controlling a charged particle beam, consistent with an embodiment of the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

The present invention is believed to be useful for laser-driven deflection arrangements and methods involving relativistic charged-particle beams. While the present invention is not necessarily limited to such applications, various aspects of the invention may be appreciated through a discussion of various examples using this context.

Embodiments of the present invention relate to systems, methods, devices and apparatus that are implemented for producing controllable charged particle beams. In one implementation, an apparatus provides a deflection force to a charged particle beam. The apparatus is implemented using an undulation structure that is substantially transparent to the electromagnetic wave and that includes a physical structure having a repeating pattern with a period and having a tilted angle, relative to a direction of travel of the charged particle beam. The pattern is arranged and used to modify a force of the electromagnetic wave upon the charged particle beam. Specific implementations allow for the undulation structure to be as small as several centimeters or less while still providing sufficient control over charged particle beams having frequencies at or exceeding X-ray frequencies.

Certain aspects of this invention relate to providing an ultra-fast and ultra-strong deflection force to a charged particle beam inside a structure compatible with known technologies including, for example, MEMS (Micro-Electro-Mechanical Systems) technology where implementations of the invention can be part of a micro-chip structure and can be formed within a micro-chip structure. The structure is powered by a laser. The rise and fall time of devices, implemented consistent herewith, are as short as a few femtoseconds and the peak deflection field can exceed 1 GV/m.

According to specific example embodiments, the present invention is directed to near-field periodic geometry that modulates the electric field experienced by the traveling particle in such a way as to produce a continuous deflection force that, depending on the application in question, can extend far beyond the wavelength of the driving electromagnetic wave (laser beam).

In certain embodiments, the invention can be fabricated with nearly any material that is transparent to the laser wavelength in question. This allows for the use of high-strength dielectric materials such as quartz, Yttrium Aluminium Garnet (YAG), alumina, or fluorides, which are low-cost and can be acquired as wafers that can be processed by micromachining technology. The deflection microstructure can be a chip-based element that has the same low cost as other typical Micro-electro-mechanical systems (MEMs) devices and furthermore can be integrated into the same chip that contains other micro-elements such as the laser-accelerator and beam detectors.

Embodiments of the present invention can be particularly useful for active nuclear or radiological detectors. One such active detector utilizes a gamma ray source and includes nuclear resonance fluorescence. Such detectors can be utilized to inspect cargo in shipping containers at seaports and border crossings, air transport containers, or to be deployed as mobile inspection systems.

Implementations of the present invention relate to table-top sized electron beam sources for Gamma and X-rays. The relatively small size allows for use in a host of applications that would otherwise be unsuitable.

Embodiments of the present invention provide focusing functionality for charged particle beams including those in the Gamma and X-ray frequencies. Gamma frequencies are above about $10^{19}$ Hz. This results in energies above 100 keV and wavelength less than 10 picometers. X-rays have a wavelength in the range of 10 to 0.01 nanometers, corresponding to frequencies in the range $3\times10^{16}$ Hz to $3\times10^{19}$ Hz and energies in the range 120 eV to 120 keV. Focusing functions can be particularly useful for imaging applications. The imaging can be medical, security or otherwise. Focusing can be helpful for providing increased precision and/or resolution for the image. Focusing functions can also be particularly useful for medical applications, such as those that would benefit from high-degree collimated and monochromatic X-rays or Gamma rays for imaging and medical treatment.

In accordance with the present invention, some (but not necessarily all) implementations incorporate and/or realize certain aspects and/or advantages as described below in the following paragraphs.

Embodiments of the present invention allow for deflection of charged particle beams including those in the Gamma and X-ray frequencies. Other embodiments of the present invention relate to ultra-fast beam switching, or kickers. Yet another embodiment includes compact isotope detectors (e.g., for use in security screening). These and other embodiments relate to deflection and steering elements for medium and high-energy charged particle beams and can use present magnet elements, which are macroscopic and are either permanent magnet based or require a strong current loop to create the deflection field. In particular embodiments, the units are readily optimized to function as a deflection structure, for use with a 60 MeV electron beam.

In certain embodiments, the dielectric structure can be driven by compact ultra-short pulse lasers and can therefore sustain very high deflection forces of several Telsa in micro-elements shorter than a millimeter, if desired. The MEMs approach for their fabrication automatically solves the external alignment problem that conventional steering elements face. In certain embodiments in which the structure is to be powered by an ultra-fast laser (e.g., as low as 10 fsec), the deflection structure can be switched on and off at that time scale, offering an important advantage for a beam extraction device of optically bunched electron beams. In some embodiments, the structure has a repetition rate that is set by the driving laser, which can be in the MHz range, as opposed to conventional electron beam facilities (rep. rate in the 100 Hz range).

In certain other embodiments, the structure involves application of a micro-undulator, e.g., of ~10 cm or less (smaller than a wafer)—integrated to a ~1 m long tabletop laser accelerator for the generation of a high peak power, high repetition rate coherent UV or x-ray source that produces a very collimated and clean beam ideal for medical applications, imaging and, in some implementations, spectroscopy. Such embodiments of the present invention can realize compactness and portability. For example, a 10 cm undulator that produces the same wavelength as a 100+ m long conventional undulator allows for a portable device that fits in a standard laboratory room, and allows for much greater flexibility than a 1 km-long multi-user facility. Also, certain aspects of this invention can solve the problem of providing low-cost, mass-producible microchip-based electron beam steering devices. Slight variations of the basic laser-deflection structure can provide for a multiplicity of applications, such as: ultrafast beam switching devices; tabletop attosecond streak cameras; ultra-short (few-cm) undulators; coherent UV or X-rays; compact isotope detectors; and imaging and screening applications.

For certain embodiments, variations in the optical phase of the laser introduce an additional acceleration or deceleration force. This allows for the enhancement of higher FEL harmonics and access to very high x-ray photon energies without altering the undulator.

In yet other embodiments, the structure includes compact electron beam manipulation elements for low energy electron beams (e.g., ultra-fast electron microscopes), and the deflection structure can be implemented to function as a microchip-based streak camera with an attosecond time resolution.

Turning now to the various example implementations shown in the figures, these examples do not limit the invention to the particular embodiments described. The invention is amenable to various modifications and alternative forms from those specific implementations depicted in the figures.

FIG. 1A depicts a system for generating and controlling a charged particle beam, consistent with an embodiment of the present invention. The system 100 includes a laser source 102 that generates a laser beam. Optical control elements 104, 106 and 108 direct the laser beam for control of a charged particle beam. Field-tip emitter 110 provides a source of charge particles. Laser injector 112 provides a laser-driving source for relativistic free particles. Laser accelerator 114 provides acceleration force and optically bunches the free particles. Laser undulator 116 provides a deflection force to the free particles.

The accelerator and undulator structures are designed to be substantially transparent to the laser beam from laser source 102. These structures include a physical shape that generates the acceleration and deflection forces. In particular, the structure has a repeating pattern that corresponds to the wavelength of the output of the system. For instance, the pattern is designed to maintain an accelerating force on particles of the beam. This can be accomplished by periodically changing the delay time required for the laser beam to pass through the structure. In one example, a grating structure is implemented to provide different effective structure widths for the laser beam.

The output of the system is a relativistic charged-particle beam operating in the frequency ranges for ultra-violet to Gamma rays. The laser undulator 116 provides a deflection force to this beam, which can focus, aim or otherwise control the path of the charged-particle beam.

FIG. 1A depicts two laser sources for providing optical-electromagnetic waves to different sides of the relativistic charged-particle beam path. These laser sources, however, can be implemented as a single source by using, for example, beam splitters or similar optical elements.

In a particular implementation, a laser-driven dielectric deflection structure acts as a building block for a compact undulator. The deflection device can be implemented in a compact structure due to its ability to support ultra-short laser pulses with deflection field values in the GV/m range. The deflection structure shares a similar geometry with dielectric grating based laser-driven particle accelerators and hence can be integrated with these into the same substrate and by the same nanofabrication process.

In one implementation, the deflection structure features three aspects; first, the generation of a phase-synchronous deflection force that allows for an interaction length that extends far beyond a single wavelength of the laser beam. The synchronicity condition is imposed by a periodic evanescent field. Second, the deflection structure provides a symmetric force pattern that minimizes the electron beam degradation. Finally, the structure is non-resonant. These properties alleviate fabrication tolerances and furthermore, they allow for application of few-cycle laser pulses.

Figure 1B:
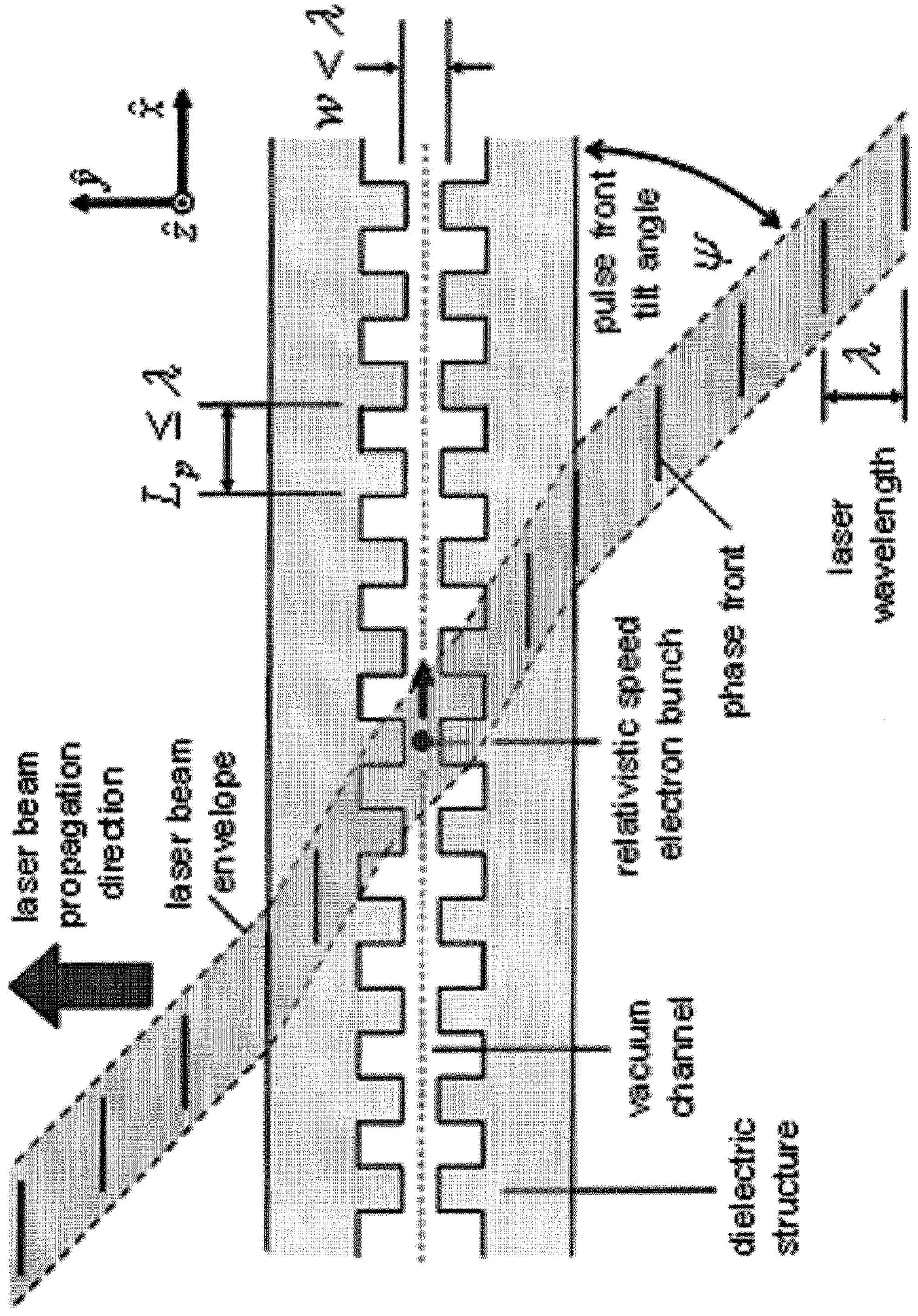
FIG. 1B depicts a top view of a proposed periodic-phase modulation accelerator structure, consistent with an embodiment of the present invention.

FIG. 1B depicts a top view of a proposed periodic-phase modulation accelerator structure, consistent with an embodiment of the present invention. The grating grooves are parallel to the $\hat{z}$ axis and the laser beam is traveling parallel to the $\hat{y}$ axis. The electron beam is traveling in the vacuum channel parallel to the $\hat{x}$ axis. The pulse front tilt causes the laser pulse envelope in the vacuum channel to remain overlapped with the relativistic electron bunch. The substrate is a dielectric material transparent to the laser wavelength in question.

The dielectric double-grating whose cross-section is depicted in FIG. 1B supports these properties. Binary quartz based gratings have become commercial components. The incoming laser beam travels in the y-direction as indicated by the solid arrow in FIG. 1B, and its phase front is parallel to the electron beam. To maintain extended overlap with the electron beam along the vacuum channel the laser beam is pulse-front tilted. The grooves of the transmission grating create phase-synchronous diffraction orders inside the vacuum channel. It has been shown that these are evanescent. For simplicity only one laser beam is shown, but the desired field symmetry is generated by a pair of laser beams approaching the structure from opposite sides.

Metallic open grating accelerator structures have been studied. The acceleration and synchronicity concepts that were developed carry over to the proposed dielectric double-grating structure, but transparent gratings allow the laser to be coupled from within the medium. This allows for a double-grating geometry that has a confined vacuum channel and that can furthermore provide a field pattern that is symmetric with respect to the electron beam orbit. In addition, the confined vacuum space brings about a different set of boundary conditions for the evanescent field when compared to the traditional, semi-open Smith-Purcell accelerator geometry.

Figure 2:
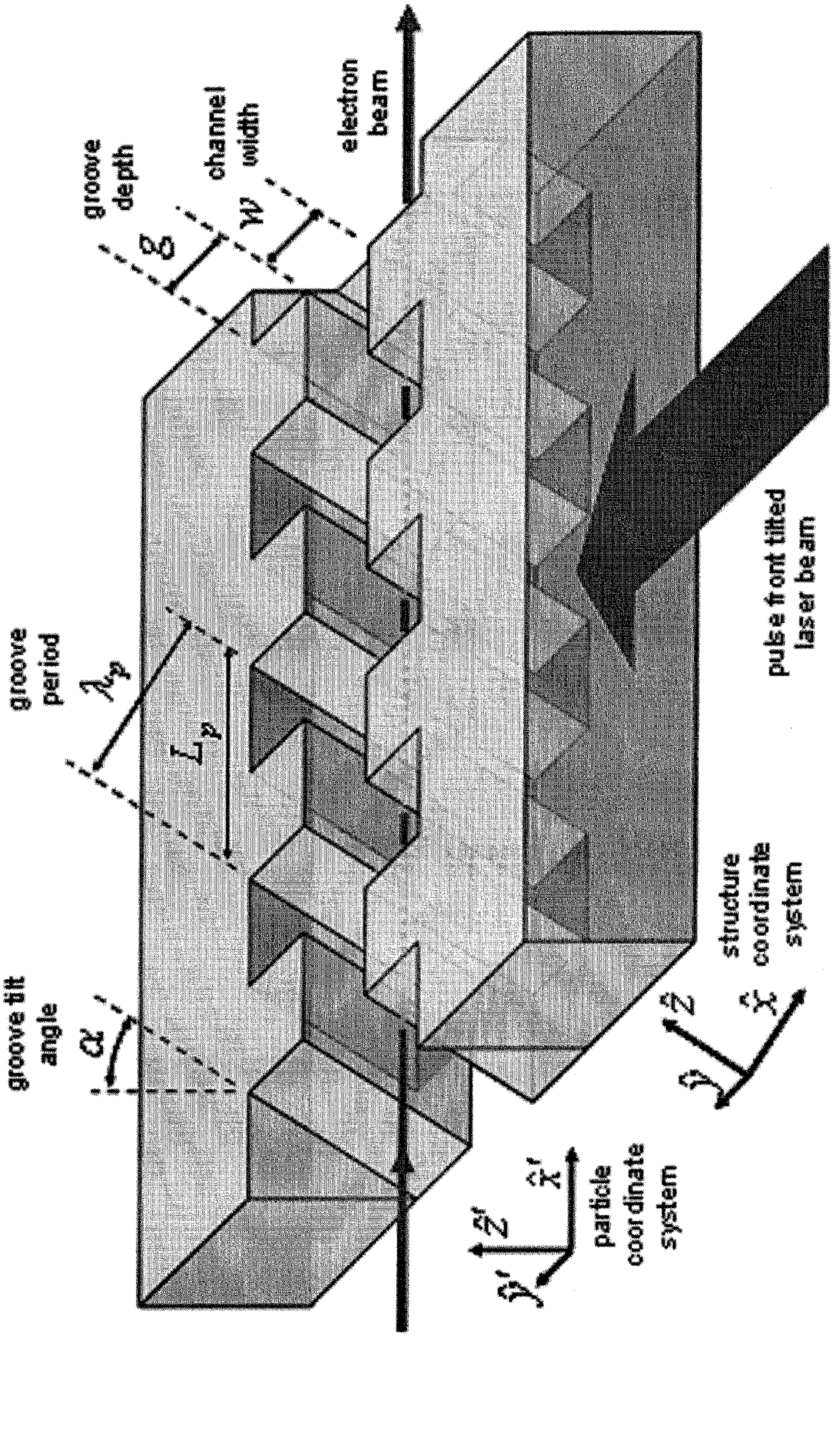
FIG. 2 shows a perspective view of the laser-driven dielectric deflection structure, consistent with an embodiment of the present invention.

FIG. 2 shows a perspective view of the laser-driven dielectric deflection structure, consistent with an embodiment of the present invention. FIG. 2 also depicts the oblique orientation of the grating grooves with respect to the electron beam in the structure.

A plane-wave field decomposition method is applied to find the diffraction modes that provide a significant deflection and have a phase velocity that is matched to that of the electron beam. The electron beam is assumed to have a velocity $|\vec{v}|=\beta c$, where $\beta$ is smaller than unity. Similar to open grating accelerators, and as shown in FIG. 2, the grating grooves have an oblique orientation with respect to the electron beam that is quantified by the angle $\alpha$. The unprimed coordinate system in FIG. 2 is aligned with the structure grooves while the primed coordinate system is aligned with the electron beam. It is found that $\alpha\neq 0$ is important for the generation of a nonzero phase-synchronous deflection force (i.e., perpendicular to the nominal beam direction). The geometry is assumed to have infinite extent along the z-coordinate. The validity of this approximation is explained by the following discussion.

A real structure and laser beam do not have infinite spatial extent. However, if the field amplitude of the laser beam is varying slowly in the z direction it can be approximated by a function of the form $$u(x,y,z)\sim a(z)b(x,y).$$

The incoming laser beam possesses a beam profile described by a slowly varying envelope function a(z). The function b(x,y) on the other hand shows a rapid spatial variation caused by the diffraction from the grating grooves which have features with a size of $\lambda$. Hence the resulting field variations include components of the form $$e^{ik_x x+ik_y y},$$

where $k_x$ and $k_y$ scale with the wavelength of the laser $k=2\pi/\lambda$. The amplitude u(x,y,z) satisfies Helmholtz equation $(\nabla^2+k^2)u(x,y,z)=0$. Thus to neglect the dependence on z it is required that the derivative of a(z) with z be small compared to the derivative of b(x,y) with respect to (x,y). This yields a condition for the minimum laser profile $w_z>>\lambda/2\pi$. A laser focus as small as $w_z\sim 50\lambda$ is readily attainable with standard focusing elements and lies well within the mentioned condition for the two-dimensional field approximation. The Rayleigh range of such a focus would correspond to $Z_R 800\lambda$, and assuming that the beam waist is at the center of the vacuum channel the radius of phase front curvature at a distance $\lambda$ away would correspond to a radius of $\sim 6\times 10^5\lambda$. This indicates that there is no significant phase variation in the z direction and that the two-dimensional diffraction analysis in the (x,y) coordinates is applicable for the described laser beam.

The electromagnetic fields can then be approximated by independent transverse electric (TE) and transverse magnetic (TM) polarizations. Here the TE polarization corresponds to the mode with the electric field parallel to the grating grooves. The period of the grating, denoted by $\lambda_p$, is $L_p=\lambda_p/\cos\alpha$.

Figure 3:
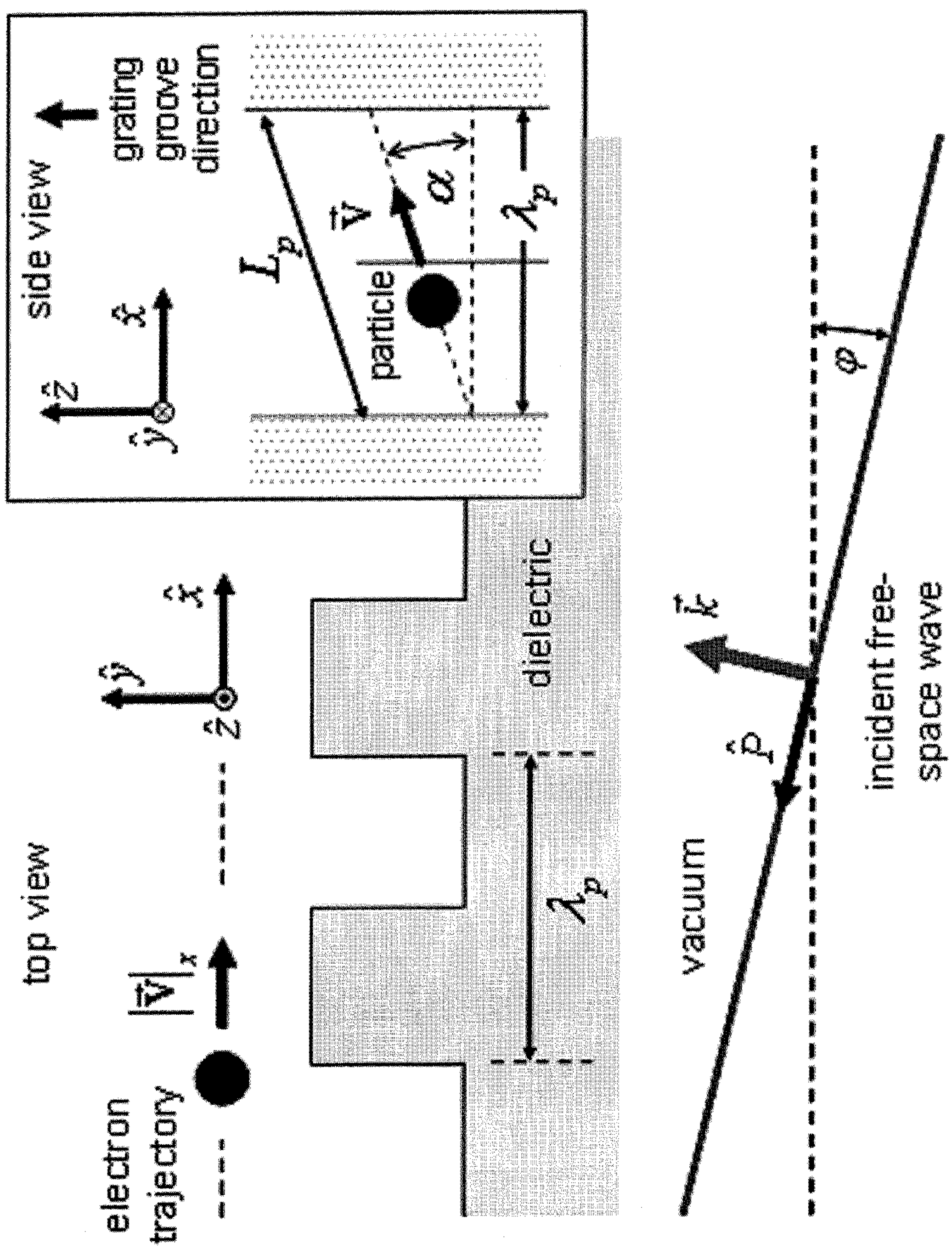
FIG. 3 depicts the geometry of the incident TM-polarized plane wave on the grating structure and the electron beam trajectory, consistent with an example embodiment of the present invention.

First assume that the laser beam is a TM-polarized monochromatic plane wave of angular frequency $\omega$. Let this wave impinge on the grating structure with an angle $\phi$ as shown in FIG. 3 (note that $\phi$ is not the pulse front tilt angle $\psi$ as shown in FIG. 1A). The electric field of such an incident wave is described by $$\vec{E}(x,y,z,t)=\hat{P}E_0 e^{i(\omega t-kx\sin\phi-ky\cos\phi)-i\Phi} \quad (1)$$

$\hat{P}$ is the polarization vector, $E_0$ is the electric field amplitude, $\Phi$ is the optical phase of the input plane wave and k is the absolute value of the free-space wave vector corresponding to $k=\omega/c$. Since the structure and the incident plane wave are assumed to extend to infinity along the grating grooves, the field components show no dependence on z, which will be omitted from here on.

FIG. 3 depicts the geometry of the incident TM-polarized plane wave on the grating structure and the electron beam trajectory, consistent with an example embodiment of the present invention. The side view inset shows the oblique orientation of the electron trajectory with respect to the grating grooves.

The field components have amplitudes u(x,y) that obey the Helmholtz wave equation $\nabla^2 u(x,y)/k^2+u(x,y)=0$. With gratings the field components satisfy a pseudo-periodicity condition of the form $u(x+\lambda_p,y)=u(x,y)e^{-i\lambda_p k\sin\Phi}$. Let $k_p=2\pi/\lambda_p$ be the grating k-vector magnitude. Then the field can be expressed as a discrete Fourier series having the form $$E_x(x,y,t)=\sum_{n=-\infty}^{+\infty}U_n(y)e^{ix(nk_p-k\sin\varphi)}e^{ikct-i\phi} \quad (2)$$

$$E_y(x,y,t)=\sum_{n=-\infty}^{+\infty}V_n(y)e^{ix(nk_p-k\sin\varphi)}e^{ikct-i\phi}$$

$$B_z(x,y,t)=\sum_{n=-\infty}^{+\infty}W_n(y)e^{ix(nk_p-k\sin\varphi)}e^{ikct-i\phi}$$

$U_n(y)$, $V_n(y)$ and $W_n(y)$ describe the amplitudes of the grating diffraction orders and their dependence on the y-coordinate can be described by $$U_n(y)=u_{n,-}e^{-\Gamma y}$$

$$V_n(y)=v_{n,+}e^{+\Gamma_n y}$$

$$W_n(y)=w_{n,+}e^{+\Gamma_n y}+w_{n,-}e^{-\Gamma_n y}. \quad (3)$$

The coefficients $\Gamma_n$ describe the mode of the $n^{th}$ grating diffraction order, and since optical field k-vector is $k=(k_x^2+k_y^2+k_z^2)^{1/2}$, these are $$\Gamma_n=\sqrt{(nk_p-k\sin\phi)^2-k^2} \quad (4)$$

If $\Gamma_n$ is real the mode is evanescent and otherwise it is propagating. The field amplitudes are related to each other, and application of Maxwell's equations shows that inside the vacuum channel they are related to $W_n(y)$ by $$U_n(y)=\frac{c}{ik}\frac{dW_n(y)}{dy} \quad (5)$$

$$V_n(y)=\frac{nk_p-k\sin\varphi}{-k/c}W_n(y)$$

Following FIG. 3 the particle's velocity is described by $\vec{v}(t)=\beta c(\hat{x}\cos\alpha+\hat{z}\sin\alpha)$ and a corresponding position $\vec{r}(t)=$ $\vec{v}t$. The Lorentz force from the TM wave acting on the particle, expressed in the (x,y,z) coordinates, is $$\vec{F}(\vec{r}(t)) = q\mathrm{Re}(\vec{E}(\vec{r}(t)) + \vec{v}\times\vec{B}(\vec{r}(t))) = q\mathrm{Re}\begin{pmatrix} E_x(\vec{r}(t)) \\ E_y(\vec{r}(t)) - \beta c B_z(\vec{r}(t))\cos\alpha \\ 0 \end{pmatrix} \tag{6}$$

The average force on the particle over an extended interaction distance is determined as follows. Let s(t)=βct be the distance traveled by the particle. The averaged force experienced by the free particle between t=0 and t=T is $$\langle F_j\rangle = \frac{1}{s(T)}\int_0^{s(T)} F_j(\vec{r}(s))\,ds, \tag{7}$$

The average force components are therefore $$\langle F_x\rangle_{TM} = q\mathrm{Re}\left(\frac{1}{s(T)}\int_0^{s(T)}\sum_{n=-\infty}^{+\infty} U_n(y)\, e^{is\cos\alpha(k_p n - k\sin\varphi)} e^{iks/\beta - i\phi}\,ds\right) \tag{8}$$

$$\langle F_y\rangle_{TM} = q\mathrm{Re}\left(\frac{1}{s(T)}\int_0^{s(T)}\sum_{n=-\infty}^{+\infty} (V_n(y) - cW(y)\beta\cos\alpha)\, e^{is\cos\alpha(k_p n - k\sin\varphi)} e^{iks/\beta - i\phi}\,ds\right)$$

$$\langle F_z\rangle_{TM} = 0.$$

The interaction is cumulative if the phase term of the exponents in equation 8 does not change with s, that is, $$nk_p - k\sin\phi + k/(\beta\cos\alpha) = 0. \tag{9}$$

Equation 9 is a Bragg diffraction condition. It represents the sought phase synchronicity condition for a particle traveling with a velocity βc in the structure shown in FIG. 2 that is illuminated by a plane wave with k-vector magnitude k and an angle of incidence ϕ. Inspection of equation 9 and the coefficient $\Gamma_n$ reveals that for β<1 and any grating tilt angle α phase synchronicity is only possible with the evanescent modes. This is in agreement with the Lawson-Woodward theorem, which states that free-space waves cannot sustain a linear long-range interaction with uniformly moving free particles. Thus, the situation is similar to linear-interaction laser-driven accelerator structures, where a cumulative nonzero laser-electron interaction (either deflection or acceleration) can only occur in the presence of a material boundary.

Next, the analysis is extended to short laser pulses, which can be represented as a superposition of plane waves with different k-vector magnitudes. Define λ as the center wavelength and $k_0=2\pi/\lambda$ as the corresponding k-vector magnitude. Equation 9 establishes that each plane wave component of the laser pulse with a specific k must satisfy a certain angle of incidence ϕ. Assume that phase-synchronicity for the center wavelength is satisfied at the angle of incidence ϕ=0. Then with equation 9 the phase synchronicity condition at the center wavelength reads $$k_0 = -nk_p\beta\cos\alpha. \tag{10}$$

Again, $k_p=2\pi/\lambda_p$ is the grating structure period. For a nonzero $k_0$ equation 10 can only be satisfied for n≦−1, which corresponds to the evanescent modes described in equation 4. Assume that the angles of incidence of the other plane wave components of different wavelength are small, such that sin ϕ~ϕ. Defining $\Delta k=k-k_0$ and $\Delta\phi=\phi-\phi_0$, where $\phi_0=0$ is the angle of incidence of the center wavelength, equation 9 can be rewritten as $$\frac{1}{\beta\cos\alpha} = k\frac{\Delta\varphi}{\Delta k} \equiv \tan\psi. \tag{11}$$

Equation 11 represents a pulse front tilt condition for an electromagnetic wave where the pulse front tilt angle is ψ, which guarantees synchronicity of the laser pulse envelope with the particle. Equations 10 and 11 establish the carrier phase and the envelope synchronicity conditions with the particle traveling down the vacuum channel at a velocity βc.

The force components $\langle F_x\rangle$, $\langle F_y\rangle$ and $\langle F_z\rangle$ in equation 8 are expressed in a coordinate system (x,y,z). However, the interest in these forces is as observed in the particle's coordinate system (x',y',z'), which is rotated by an angle α about the y-axis:

$$\langle F_{x'}\rangle = +\langle F_x\rangle\cos\alpha + \langle F_z\rangle\sin\alpha \equiv \langle F_{acc}\rangle$$

$$\langle F_{z'}\rangle = -\langle F_x\rangle\sin\alpha + \langle F_z\rangle\cos\alpha \equiv \langle F_{\perp,z'}\rangle$$

$$\langle F_{y'}\rangle = \langle F_y\rangle \equiv \langle F_{\perp,y'}\rangle \tag{12}$$

$\langle F_{acc}\rangle$ is the average acceleration force experienced by the particle. $\langle F_{\perp,y'}\rangle$ and $\langle F_{\perp,z'}\rangle$ are the average horizontal and vertical deflection forces respectively. For the TM-polarized laser beam at phase-synchronicity these force components reduce to $$\langle F_{x'}\rangle_{TM} = \frac{qc}{ik}\mathrm{Re}\left(e^{-i\phi}\sum_n \frac{dW_n(y)}{dy}\right)\cos\alpha \equiv \langle F_{acc}\rangle \tag{13}$$

$$\langle F_{\perp,y'}\rangle_{TM} = qc\left(\frac{1}{\beta\cos\alpha} - \beta\cos\alpha\right)\mathrm{Re}\left(e^{-i\phi}\sum_n W_n(y)\right)$$

$$\langle F_{\perp,z'}\rangle_{TM} = -\frac{qc}{ik}\mathrm{Re}\left(e^{-i\phi}\sum_n \frac{dW_n(y)}{dy}\right)\sin\alpha.$$

The tilt angle and the grating groove shape can be optimized for the largest possible deflection force.

The described evanescent field pattern possesses the desired synchronicity conditions but is non-uniform and asymmetric. Furthermore, the deflection force is not aligned with the structure coordinates. A practical beam manipulation element is preferably able to generate a deflection force that possesses a high degree of uniformity, symmetry along the vacuum channel, and furthermore is aligned to the beam coordinates. Excitation of symmetric field Eigen modes in the vacuum channel is one solution that has been explored. A particular application of interest involves ultra-short, few-cycle laser pulses and hence cannot resort to this solution. Instead, the transparent grating structure can be illuminated from opposite sides to generate a symmetric field pattern and, depending on the choice of polarization and relative phase, can control the direction of the deflection.

The addition of two TM-polarized laser beams that are in phase at the center of the vacuum channel results in a laser field amplitude that modifies the expression of $W_n(y)$ in equation 3 to a hyperbolic function.

$$W_n(y) = w_n\cos h(\Gamma_n y);\ w_n = 2(w_{n,+} + w_{n,-}) \tag{14}$$

The amplitude components in equation 13 yield force components on the electrons that are of the form $$\langle F_{acc}\rangle(y) = \frac{qc}{ik}\cos\alpha\,\mathrm{Re}\left(e^{-i\phi}\sum_n w_n\Gamma_n\sinh(\Gamma_n y)\right) \tag{15}$$

$$\langle F_{\perp,y'}\rangle(y) = qc\left(\frac{1}{\beta\cos\alpha} - \beta\cos\alpha\right)\mathrm{Re}\left(e^{-i\phi}\sum_n w_n\cosh(\Gamma_n y)\right)$$

$$\langle F_{\perp,z'}\rangle(y) = -\frac{qc}{ik}\sin\alpha\,\mathrm{Re}\left(e^{-i\phi}\sum_n w_n\Gamma_n\cosh(\Gamma_n y)\right)$$

The deflection component $\langle F_{\perp,y'}\rangle$ remains uniform in the neighborhood of the vacuum channel center due to the cos h($\Gamma_n$y) function while the other components show a dependence that is nearly linear with the y-coordinate and that vanishes at the vacuum channel center. This configuration results in a force pattern that skews the beam and ultimately degrades its emittance. However, if the laser beams are out of phase by π with respect to each other the amplitude function $W_n(y)$ in equation 14 changes parity to an odd function $W_n(y)=w_n$ sin h($\Gamma_n$y) where now $w_n=2(w_{n,+}-w_{n,-})$ and therefore the force components modify to $$\langle F_{acc}\rangle(y) = \frac{qc}{ik}\cos\alpha\,\mathrm{Re}\left(e^{-i\phi}\sum_n w_n\Gamma_n\cosh(\Gamma_n y)\right) \tag{16}$$

$$\langle F_{\perp,y'}\rangle(y) = qc\left(\frac{1}{\beta\cos\alpha} - \beta\cos\alpha\right)\mathrm{Re}\left(e^{-i\phi}\sum_n w_n\sinh(\Gamma_n y)\right)$$

$$\langle F_{\perp,z'}\rangle(y) = -\frac{qc}{ik}\sin\alpha\,\mathrm{Re}\left(e^{-i\phi}\sum_n w_n\Gamma_n\cosh(\Gamma_n y)\right)$$

The deflection force that is oriented into the walls of the structure, $\langle F_{\perp,y'}\rangle$, scales as sin h($\Gamma_n$y) and therefore acts, depending on the optical phase, as a focusing or a defocusing lens. The deflection force along the vacuum channel, $\langle F_{\perp,z'}\rangle$, and the acceleration force remain nearly uniform and maximized at vacuum channel center. This is a favorable laser beam configuration since it allows for extended transport of a beam that is tightly focused in the y-direction while providing a uniform deflection parallel to the vacuum channel. Note that a periodic reversal of the groove tilt angle α→−α inverts the lens produced by $\langle F_{\perp,y'}\rangle$ and the acceleration from $\langle F_{acc}\rangle$ while preserving the deflection direction of $\langle F_{\perp,z'}\rangle$. The ideal electron beam profile for this structure is therefore a sheet beam of very narrow, sub-wavelength extent in the y-dimension but wider extent of several microns along the vacuum channel.

Figure 4:
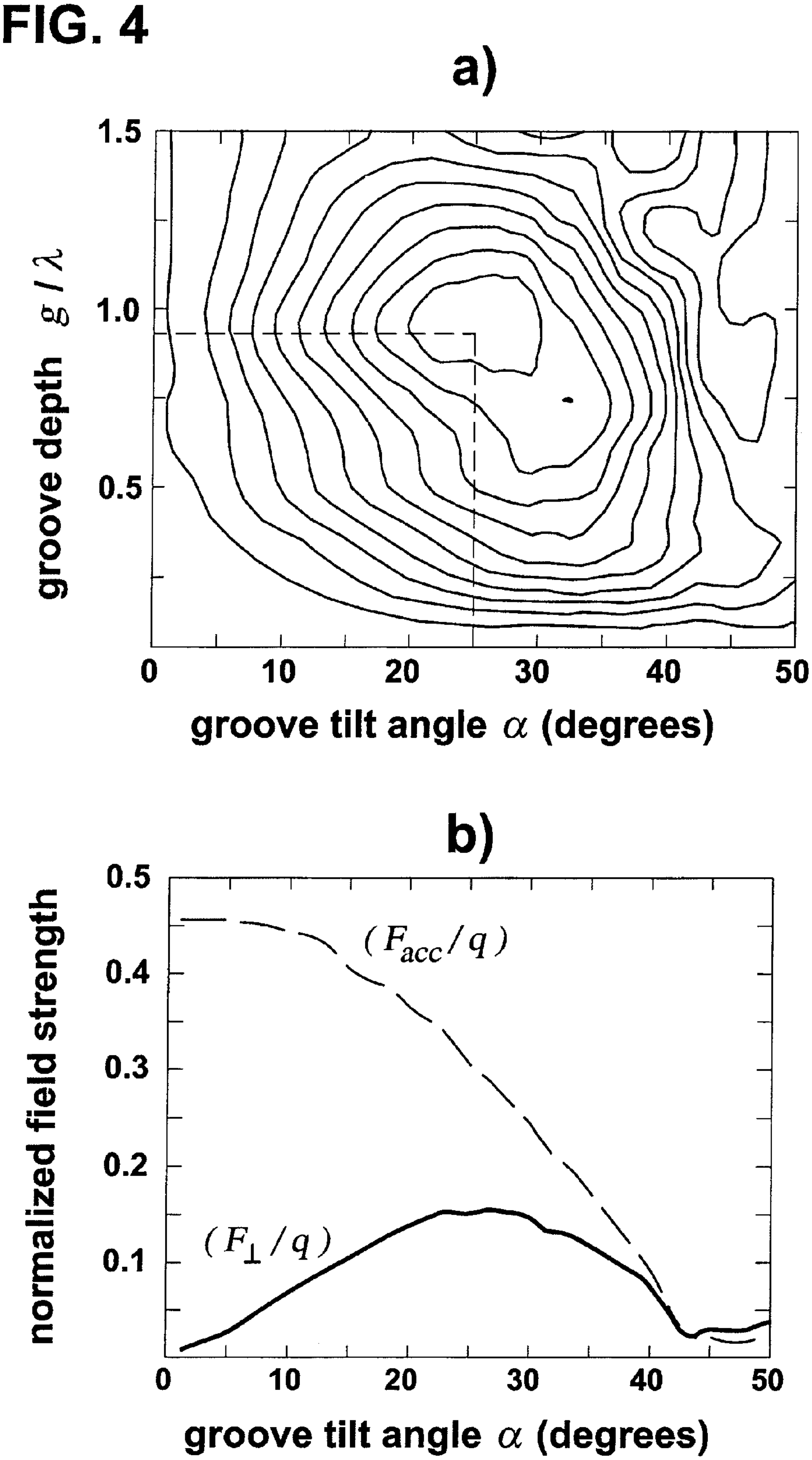
FIG. 4A shows a contour map of the magnitude of the expected total deflection force component as a function of the tilt angle and the groove depth, consistent with an example embodiment of the present invention.
FIG. 4B shows the dependence of the deflection force at the optimum groove depth as a function of groove tilt angle, consistent with an example embodiment of the present invention.

Many materials are compatible with nanofabrication techniques for deep groove etching including, but not limited to, silicon or quartz. The latter features higher laser damage fluence for near-infrared wavelengths, which can be advantageous for various applications. Since the deflection field is evanescent the vacuum channel width is kept within less than one laser wavelength. As an example, consider a quartz based structure with an index of refraction of 1.58 having a channel width w=0.4λ. The remaining free parameters for the binary grating structure as shown in FIG. 2 are the groove depth g and tilt angle α. Assume a single input laser beam with a field amplitude normalized to $|E_{laser}|=1$. FIG. 4A shows a contour map of the magnitude of the expected total deflection force component $\langle F_\perp\rangle=(\langle F_{\perp,y'}\rangle^2+\langle F_{\perp,z'}\rangle^2)^{1/2}$ as a function of the tilt angle α and the groove depth g. The maximum deflection occurs at a groove depth g=0.85λ and at a tilt angle α=25° . For these parameters $\langle F_{\perp,y'}\rangle$ and $\langle F_{\perp,z'}\rangle$ have nearly equal amplitude. FIG. 4B shows the dependence of the deflection force at the optimum groove depth g=0.85λ as a function of groove tilt angle α. The accelerating force component steadily decreases with an increasing tilt angle α. At the optimum tilt angle the magnitude of the deflection is $\langle F_\perp/q\rangle\sim0.15$ and the acceleration is $\rangle F_{acc}/q\rangle\sim0.3$. Thus about 15% of the input laser field can be transformed to a phase-synchronous deflection component. Both acceleration and deflection are present. However, the application of two laser beams allows for cancellation of specific force components.

The maximum field amplitude value for the proposed structure is located at the structure walls in the narrow part of the vacuum channel, which has to remain below the breakdown threshold of the material. A finite-difference time-domain (FDTD) simulation shows that the amplitude at that location is $|E_{surface}|\sim3|E_{laser}|$. For quartz, application of laser peak intensities greater than $10^{14}$ W/cm$^2$ without damage have been observed with 10 fsec laser pulses, corresponding to a peak amplitude of $|E_{breakdown}|\sim27$ GV/m on the grating walls. The corresponding maximum laser field within the vacuum channel therefore is $|E_{laser}|\sim9$ GV/m and the magnitude of the maximum deflection field is $\rangle F_\perp/q\rangle 1.4$ GV/m (9*0.15=1.35—which can be rounded up to 1.4 GV/m if so desired).

FIGS. 4A and 4B show optimization of the geometry of a quartz based structure with an index of refraction n=1.58 at 800 nm, consistent with an embodiment of the present invention. FIG. 4A shows a contour map of the magnitude of the average deflection force. Each contour line represents a 10% drop from the maximum value. FIG. 4B shows the magnitude of the average acceleration and deflection forces at g=0.85λ as a function of groove tilt angle. The field strength is normalized to the peak electric field $|E_{laser}|$.

Fabrication tolerances are considered next. FIG. 4A shows that the magnitude of the deflection is a slowly varying function of the groove depth, and near the optimum parameters the groove depth can vary by ~10% without a significant loss in the deflection force. Control of the etch depth on quartz structures to within 1% has been reported. Another fabrication aspect is the tolerance of the grating period. Modification of equation 9 reveals that for the grating order n=−1 the accumulated phase mismatch ΔΦ over a grating length L reads $\Delta L/L=(\Delta\phi/2\pi)(\lambda_p/L\beta\cos\alpha)$. Assuming a tolerance condition of ΔΦ equal to 1 degree for a grating of period $\lambda_p$=800 nm over L=1 cm, a groove position tolerance of ΔL~2nn can be obtained. Deep-UV lithography fabrication techniques have shown line-width uniformity values of 0.1 nm over 1 cm distances. The tight tolerance of the length and the thermal expansion coefficient of ~5×10$^{-7}$/° C. for quartz establish a limited operating temperature range for the cm-long grating of ~½° C. but also allows for post-fabrication temperature-controlled tuning of the structure, in similar fashion as is carried out with conventional metal structure accelerators.

Beam steering devices are found in applications such as kickers for high energy beams, electron sweepers for A-D converters, and streak cameras. Their development toward increased sweep speed remains an active field of research. The state-of-the-art deflectors are millimeter-scale electronic elements that are based on circuit- and RF-based traveling wave deflection concepts. The proposed laser-driven deflection structure represents the extension of these RF-based deflection concepts to optical wavelengths to reach time resolution values in the sub-fs scale.

FIG. 5A shows the profile of the electron beam inside the deflection device, having dimensions $\sigma_{0,y'}$ and $\sigma_{0,z'}$, where $\sigma_{0,z'} >> \sigma_{0,y'}$, consistent with an embodiment of the present invention. The laser beams powering the structure are set to be out of phase by $\pi$, generating a deflection force parallel to the vacuum channel.

FIG. 5B shows a transverse view of the deflector structure, the focusing structure and the electron beam, consistent with an embodiment of the present invention. The solid arrows indicate the expected force generated by the laser beam pattern on the electron beam.

A focusing element enhances angular resolution along the deflection coordinate. The same type of double grating structure can be used for this purpose, as is illustrated in FIG. 5B. The focusing element introduces a position dependent deflection angle of the form $\theta(z')=\theta_0+z'/f$ where $\theta_0$ is the original beam direction upstream of the focusing element and f is the effective focal length. For example, replacing the uniform laser beam with a laser field spatial envelope of the form $A(z')\propto z'$ generates the desired focusing. Therefore, the resulting focal length f from a field with profile variation dA/dz' over a structure length $L_F$ is $$\frac{1}{f}=\left|\frac{d\theta}{dz'}\right|=0.15\frac{qL_F}{\gamma m\beta^2c^2}\left(\frac{dA}{dz'}\right). \quad (17)$$

The factor 0.15 is the deflection field to input field ratio as discussed herein. A pair of TEM01 (Transverse Electro Magnetic) beams with peak field amplitude $E_0$=9 GV/m and vertical spot size of ~1 mm possess an amplitude variation $dA/dz' \sim 10^{13}$ V/m$^2$ near the center of the beam. For a focusing element length $L_F$=100 μm and a 10 MeV electron beam equation 16 predicts a focal length of ~10 cm.

Define the angular resolution as the ratio of the transverse sweep range $z'_f$ versus the beam spot size at the observation plane, that is, $R'=z_f/\sigma_{f,z'}$. Similar to a Gaussian laser beam the electron beam spot size evolution is parameterized by a beam waist spot size $\sigma_{f,z'}$ in the focal plane and a depth of focus $\beta_{f,z'}$. The spot sizes $\sigma_{0,z'}$ and $\sigma_{f,z'}$ are related to the focal length f and the depth of focus $\beta_{f,z'}$ by an equation of the form $$\sigma_{0,z'}=\sigma_{f,z'}(1+f^2/\beta_{f,z'}^2)^{1/2}. \quad (18)$$

For a deflection force $\langle F_{\perp,z'}\rangle$, a deflector structure length $L_D$ and a focal length f, the resulting deflection is $z'_f \sim fL_D\langle F_{\perp,z'}\rangle/\gamma mc^2$ and the resolution becomes $$R=z'_f/\sigma_{f,z'}\sim\frac{fL_D\langle F'_{\perp,z}\rangle}{\sigma_{f,z'},\gamma mc^2}. \quad (19)$$

Optimization of R suggests minimizing the focal plane spot size $\sigma_{f,z'}$. As shown in equation 18 for a given $\sigma_{0,z'}$, $\sigma_{f,z'}$ is a function of the focal length f and the depth of focus of the electron beam, $\beta_{f,z'}=\sigma^2_{f,z'}/4\epsilon_{\perp,z'}$, which depends on the transverse geometric emittance of the beam $\epsilon_{\perp,z'}$. Ideal electron sources for this application are laser-driven field emitters capable of ultra-low emittance values followed by a dielectric-structure laser-accelerator. Such devices are expected to support geometric electron beam emittance values of $\epsilon_\perp \sim 10^{-9}/\gamma$m[26,27]. As a criterion for the permissible structure length $L_D+L_F<2\beta_{0,y'}$ is selected, where $\beta_{0,y'}=\sigma^2_{0,y'}/4\epsilon_{\perp,y'}$. Since the vacuum channel has a sub-micron width the electron spot size should be on the order of $$\sigma_{0,y'}\sim\frac{1}{10}\ \mu\text{m}.$$

Figure 6:
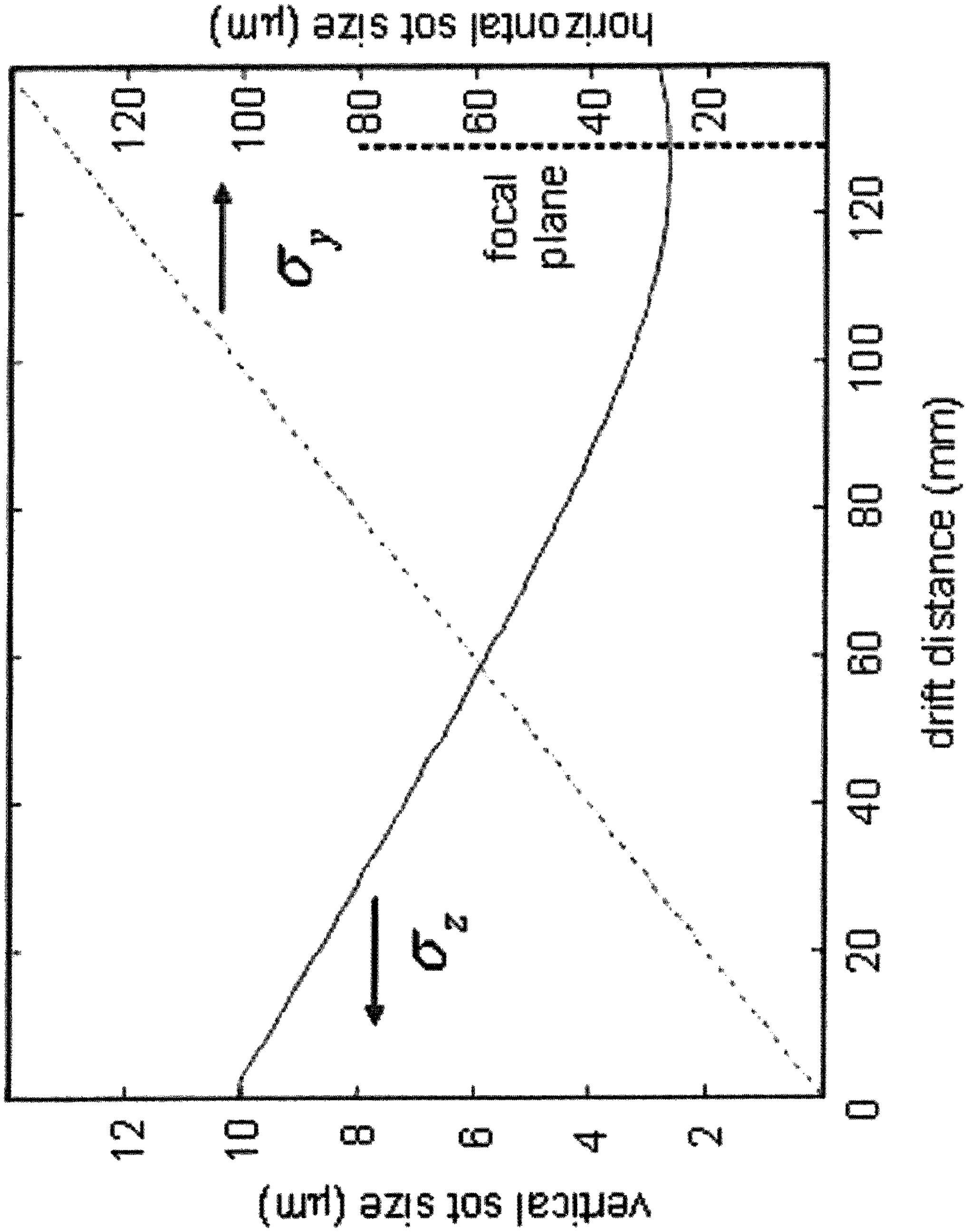
FIG. 6 shows a transverse beam profile as a function of distance behind the structure shown in FIG. 5, consistent with an embodiment of the present invention.

Higher beam energies allow for a lower geometric emittance and consequently for a longer deflection structure. With these constraints the resolution improves with higher beam energies and with a configuration where most of the structure is deflecting and only a small section is focusing, that is, $L_D >> L_F$. For example consider a 10 MeV energy, $\epsilon_{\perp,z'} \sim \epsilon_{\perp,y'} \sim 10^{-9}/\gamma$m electron beam. This constrains the total structure length $L_D+L_F$ to ~250 μm, and optimization of equation 18 leads to a geometry of $L_D \sim 9L_F$. Thus the focusing segment is 25 μm long and the corresponding focal length is about 13.4 cm. FIG. 6 shows the evolution of the electron beam y- and z-envelopes for the given example downstream of the structure. At the focal plane the spot size in the sweep direction is 2 μm while its other dimension is ~100 times larger. The resolution for this configuration is $R \sim 10^3$, corresponding to a time resolution of 3 attoseconds for a ~1 μm driving laser wavelength. Since the driving waveform is sinusoidal in time only ~10% of the cycle corresponds to a sweep that is approximately linear. However, ongoing research with femtosecond lasers is headed for the generation of optical pulse shapes such as sawtooth and triangle waves. Assuming the structure supports the bandwidth carried by such pulses it could feature a resolution that approaches R=1000.

Figure 5:
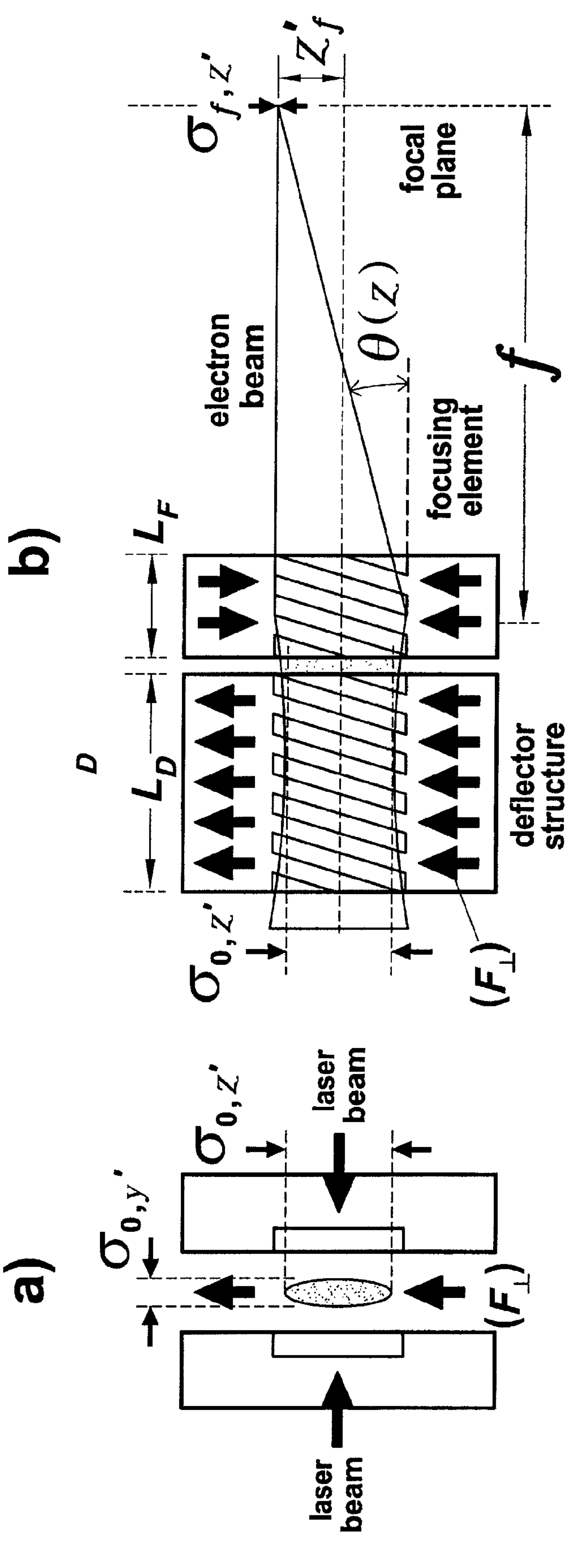
FIG. 5A shows the profile of the electron beam inside the deflection device, consistent with an embodiment of the present invention.
FIG. 5B shows a transverse view of the deflector structure, the focusing structure and the electron beam, consistent with an embodiment of the present invention.

FIG. 6 shows a transverse beam profile as a function of distance behind the structure shown in FIG. 5, consistent with an embodiment of the present invention. Without further focusing elements the beam comes to a line focus about 13 cm downstream.

The 2 μm spot size at the focal plane corresponds to the smallest CCD pixel size values for commercially available image detectors and with the parameters given each 2 um pixel would correspond to 3 as in time resolution, and ~100 pixel could be linearly streaked. Imaging of MeV-energy electron beams can be accomplished with scintillator materials such as Ce:YAG, which shows a fluorescence life time of ~100 nsec. The readout speed is limited by this lifetime, and for electron bunch repetition rates above 10 MHz the streak camera displays an average temporal structure of the electron beam within the laser optical cycle.

The maximum deflection field was found to be $\langle F_\perp/q\rangle \sim 1$ GV/m, which leads to a beam bending radius of $r=\gamma m\beta^2c^2/\langle F_\perp\rangle$. For few-MeV beam energies it can be on the order of one cm, allowing for the possibility of fitting an electron ring into a few-cm diameter device. Besides the deflector units an electron ring requires input and exit beam kickers, accelerator and focusing sections.

Figure 7:
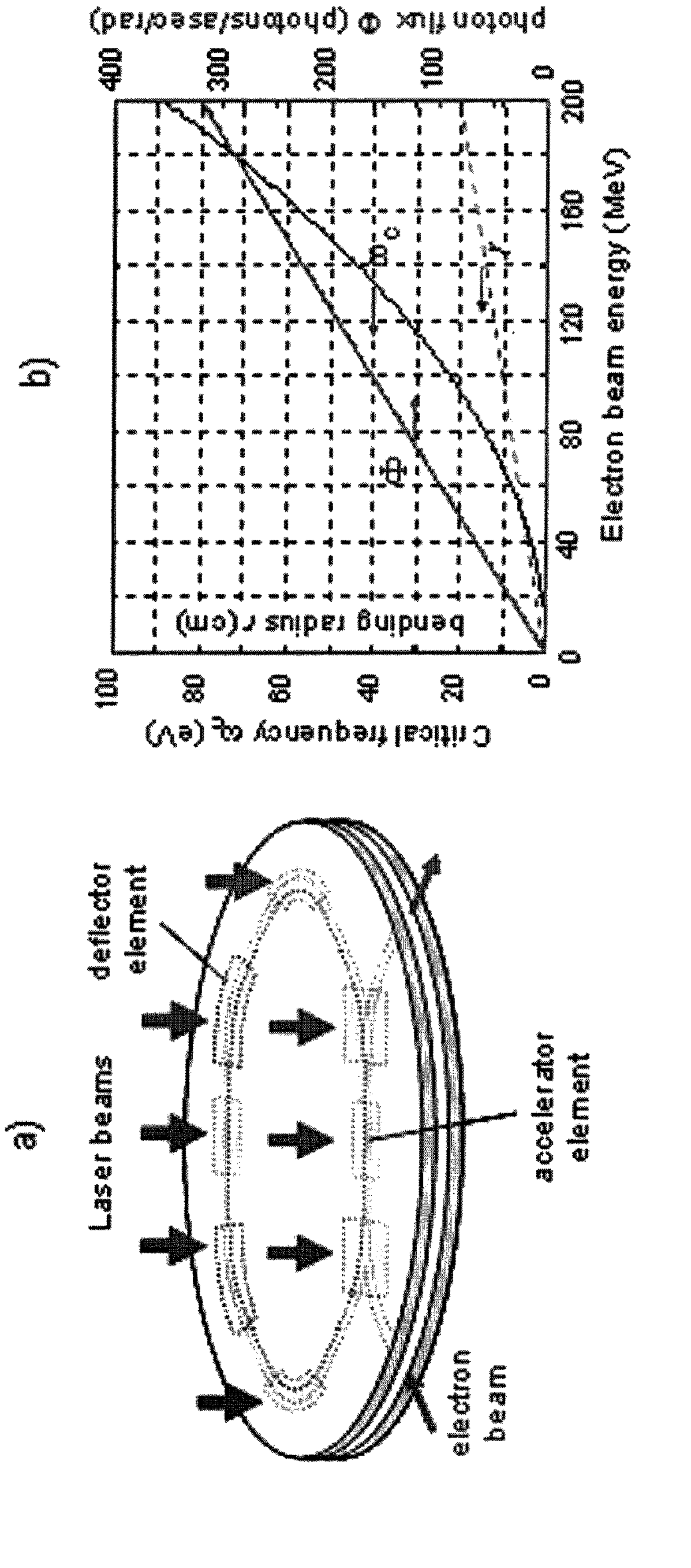
FIG. 7A shows a schematic of an electron ring based on dielectric grating manipulation elements, consistent with an embodiment of the present invention.
FIG. 7B shows synchrotron parameters as a function of beam energy, consistent with an embodiment of the present invention.

FIG. 7A shows a schematic of an electron ring (or circular-like shape) based on dielectric grating manipulation elements, consistent with an embodiment of the present invention. As shown in FIG. 7A, these binary grating elements are envisioned to be fabricated onto a pair of quartz wafers and be powered by the corresponding laser beam modes. FIG. 7B shows synchrotron parameters as a function of beam energy, consistent with an embodiment of the present invention. FIG. 7B shows the bending radius, synchrotron critical frequency $\omega_c$ and photon flux (within 0.1% of $\omega_c$) for a 10 fC, 100 attosecond electron bunch as a function of beam energy. At 20 MeV the electron bunch would generate a GHz-repetition visible light pulse train with a radiation energy loss of ~1 eV per turn. At 200 MeV the required bending radius is ~20 cm, the peak radiation wavelength is 14 nm, and the synchrotron radiation energy loss is hundreds of eV per turn. One implementation of such a device is for a compact and high-repetition rate collimated extreme Ultraviolet (EUV) source.

Figure 8:
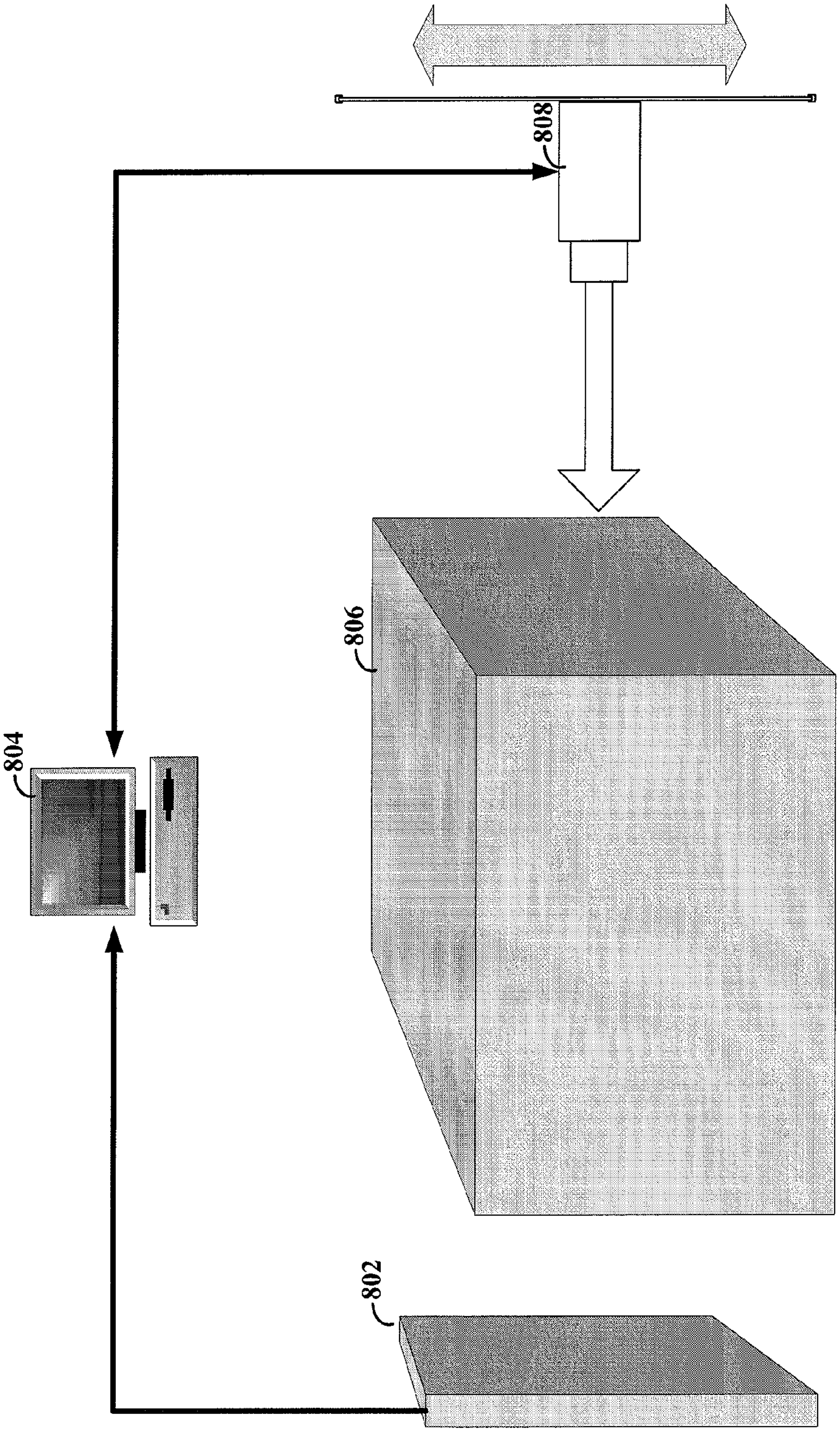
FIG. 8 shows an imaging system, consistent with an embodiment of the present invention.

FIG. 8 shows an imaging/detection system, consistent with an embodiment of the present invention. Block 802 represents a sensor that detects particles from, or caused by interaction with, the charged particle source 808. Due in part to the small size of the charged particle source 808, the charged particle source 808 can be easily mounted on a movable arm. This can facilitate scanning of the imaged object 806. The operation of the charged particle source can be controlled using integrated circuitry, one or more external processors 802 or combinations thereof.

There exist a substantial number of different configurations for implementing an imaging/detection system including, but not limited to, multiple sensors/particle sources, specially designed hardware processors, programmable logic arrays, computers configured with software and combinations thereof. Moreover, the imaging/detection applications are not necessary limited to those specific applications mentioned herein.

Certain aspects of the present invention are embodied in forms of a method and/or apparatus (such as a system, structure and/or arrangement) involving provision of an ultra-fast and ultra-strong deflection force to a charged particle beam inside a compatible structure. Some of these aspects involve a phase-synchronous deflection component/method that provides phase synchronicity between a deflection force from the laser and the electric beam for a distance that is much greater than the laser wavelength. Implementations of the present invention have been found to benefit applications using known technologies including, for example, MEMS (Micro-Electro-Mechanical Systems) technologies. In such applications, implementations of the invention can be part of the structure using the known technology, such as a micro-chip structure where implementations can be formed within a micro-chip structure. It will be appreciated, however, that while beneficial to such applications, implementations of the invention are not so limited.

The following documents further illustrate examples of embodiments and aspects useful for implementing the present invention. These documents, incorporated fully by reference, are included as part of the above-noted underlying provisional application and/or published as follows:

Plettner, T., Byer, R. L., "Proposed dielectric-based microstructure laser-driven undulator," *Phys. Rev. Special Topics-Accelerators and Beams*, Vol. 11, Issue 3, pp. 030704 (March 2008);

T. Plettner and R. L. Byer, "Proposed Tabletop Laser-driven Coherent X-Ray Source." *Proceedings of PAC07*, Albuquerque, N. Mex., USA;

T. Plettner and R. L. Byer, "Photonic Device Particle Accelerators and Light Sources" *CLEOE-IQEC* (2007);

T. Plettner and R. L. Byer, "A Proposed Laser-Driven, Dielectric Microstructure Few-cm Long Undulator for Attosecond Coherent X-Rays"; and T. Plettner, "Phase-synchronicity Conditions from Pulse-front Tilted Laser Beams on One-dimensional Periodic Structures and Proposed Laser-driven Deflection," *SLAC-PUB-12458* (2007).

The skilled artisan would recognize that the present invention is applicable to the references listed in these attachments, and that various example embodiments of the present invention, including those discussed above, may be implemented and/or modified in a manner related to one or more of such listed references. The various embodiments described above are provided by way of illustration only and should not be construed to limit the invention. Based upon the above discussion and illustrations, those skilled in the art will readily recognize that various modifications and changes may be made to the present invention without strictly following the exemplary embodiments and applications illustrated and described herein. Such modifications and changes do not depart from the true spirit and scope of the present invention, which is provisionally set forth in the following claims without limitation.

What is claimed is:

1. An apparatus for providing a deflection force to a charged particle beam, the apparatus comprising:

a source for producing an electromagnetic wave;

an undulation structure that is substantially transparent to the electromagnetic wave and that includes a physical structure having a repeating pattern with a period L and having a tilted angle α, relative to a direction of travel of the charged particle beam, the pattern modifying a force of the electromagnetic wave upon the charged particle beam, wherein L and α are non-zero values; and a direction device for introducing the electromagnetic wave to the undulation structure to provide a phase-synchronous deflection force to the charged particle beam.

2. The apparatus of claim 1, wherein the electromagnetic wave has a frequency of above and the charged particle beam has a frequency greater than about $3\times10^{16}$ Hz.

3. The apparatus of claim 1, wherein the electromagnetic wave is a laser beam.

4. The apparatus of claim 1, wherein the tilted angle α is greater than 0° and less than or equal to 90°.

5. The apparatus of claim 1, wherein the period L is less than or equal to a wavelength of the electromagnetic wave.

6. The apparatus of claim 1, wherein the direction device is configured to introduce the electromagnetic wave to the undulation structure with a pulse front tilt that maintains overlap between an electromagnetic wave pulse envelope with the charged particle beam.

7. The apparatus of claim 1, wherein the undulation structure is less than 1 meter along the direction of travel of the charged particle beam.

8. The apparatus of claim 1, wherein the undulation structure is a micro-undulator of less than 10 centimeters along the direction of travel of the charged particle beam.

9. The apparatus of claim 1, wherein the apparatus provides repetition rates of a Megahertz.

10. The apparatus of claim 1, wherein the undulation structure includes dielectric materials from at least one of quartz, Yttrium Aluminium Garnet (YAG), alumina, and fluorides.

11. The apparatus of claim 1, wherein the apparatus is less than 10 meters in length along a direction of travel of the charged particle beam.

12. The apparatus of claim 1, wherein the pattern is a grating that includes alternating thicknesses in a direction of travel of the electromagnetic wave.

13. An electron ring device for providing a charged particle beam, the device comprising:

a source for producing an electromagnetic wave;

a undulation structure includes a lumen providing a ring-shaped path for guiding the charged particle beam, and at least one deflection component that is substantially transparent to the electromagnetic wave and that includes a physical structure having repeating pattern having a period L and a tilted angle α, relative to a direction of travel of the charged particle beam, the pattern modifying force of the electromagnetic wave upon the charged particle beam, wherein L and $\alpha$ are non-zero values, and a direction device for introducing the electromagnetic wave to the structure to provide a phase-synchronous deflection force to the charged particle beam.

14. An imaging device using a charged particle beam, the device comprising:

a source for producing an electromagnetic wave;

a structure, that is substantially transparent to the electromagnetic wave, including a physical structure having repeating pattern having a period L and a tilted angle $\alpha$, relative to a direction of travel of the charged particle beam, the pattern modifying force of the electromagnetic wave upon the charged particle beam, wherein L and $\alpha$ are non-zero values;

a electromagnetic wave director for introducing the electromagnetic wave to the structure to provide a phase-synchronous deflection force to the charged particle beam; and a sensor for detecting the charged particle beam.

15. The device of claim 14, wherein the sensor is made from scintillator materials.

16. The device of claim 14, wherein the device has a focal length of about 10 centimeters.

* * * * *